United States Patent
Seong

(10) Patent No.: US 10,283,203 B2
(45) Date of Patent: May 7, 2019

(54) SEMICONDUCTOR MEMORY DEVICE AND METHOD OF OPERATING THE SAME

(71) Applicant: SK hynix Inc., Gyeonggi-do (KR)

(72) Inventor: Jin Yong Seong, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 15/606,798

(22) Filed: May 26, 2017

(65) Prior Publication Data

US 2018/0075910 A1    Mar. 15, 2018

(30) Foreign Application Priority Data

Sep. 12, 2016 (KR) .......................... 10-2016-0117333

(51) Int. Cl.

| | | |
|---|---|---|
| *G11C 16/10* | (2006.01) | |
| *G11C 16/04* | (2006.01) | |
| *G11C 16/34* | (2006.01) | |
| *G11C 16/26* | (2006.01) | |
| *G11C 16/30* | (2006.01) | |
| *G11C 16/08* | (2006.01) | |
| *G11C 16/24* | (2006.01) | |
| *G11C 11/34* | (2006.01) | |
| *G11C 11/063* | (2006.01) | |
| *G06F 13/16* | (2006.01) | |
| *G11C 7/10* | (2006.01) | |
| *G11C 16/22* | (2006.01) | |

(52) U.S. Cl.
CPC .............. *G11C 16/10* (2013.01); *G06F 13/16* (2013.01); *G11C 7/1063* (2013.01); *G11C 11/063* (2013.01); *G11C 11/34* (2013.01); *G11C 16/0483* (2013.01); *G11C 16/08* (2013.01); *G11C 16/22* (2013.01); *G11C 16/24* (2013.01); *G11C 16/26* (2013.01); *G11C 16/30* (2013.01); *G11C 16/3436* (2013.01)

(58) Field of Classification Search
CPC . G11C 16/10; G11C 16/0483; G11C 16/3486; G11C 16/26; G11C 11/063; G11C 16/08; G11C 16/24; G11C 11/34; G11C 16/30
See application file for complete search history.

(56) References Cited

U.S. PATENT DOCUMENTS

| | | | | |
|---|---|---|---|---|
| 7,843,758 B2 * | 11/2010 | Byeon | ................. | G06F 13/1684 365/185.11 |
| 8,179,732 B2 * | 5/2012 | Kang | ................... | G11C 7/1051 365/191 |

(Continued)

FOREIGN PATENT DOCUMENTS

KR    1020040022277    3/2004

*Primary Examiner* — Tri M Hoang
(74) *Attorney, Agent, or Firm* — IP & T Group LLP

(57) ABSTRACT

Provided herein are a semiconductor memory device and a method of operating the same. The semiconductor memory device includes a memory cell array including a plurality of memory cells, a status signal generator configured to output an internal status signal indicating whether an operation of the memory cell array has been completed or is being performed and a ready/busy line input mode control unit configured to output a ready/busy signal through a ready/busy line based on the internal status signal or to receive an input signal from an external device through the ready/busy line.

18 Claims, 10 Drawing Sheets

(56) References Cited

U.S. PATENT DOCUMENTS

2014/0204684 A1* 7/2014 Kwak .................. G11C 7/10
 365/189.05
2015/0143155 A1* 5/2015 Cho ..................... G11C 5/066
 713/401

* cited by examiner

US 10,283,203 B2

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2016-0117333, filed on Sep. 12, 2016, the entire disclosure of which is incorporated herein by reference in its entirety.

BACKGROUND

Field of Invention

Various embodiments of the present disclosure relate to a semiconductor memory device and a method of operating the semiconductor memory device.

Description of Related Art

Semiconductor memory devices are memory devices realized using a semiconductor such as silicon (Si), germanium (Ge), gallium arsenide (GaAs), indium phosphide (InP), or the like. Semiconductor memory devices are classified into volatile and nonvolatile memory devices.

A volatile memory device is a memory device in which data stored therein is lost when power is turned off. Representative examples of a volatile memory device include a static RAM (SRAM), a dynamic RAM (DRAM), and a synchronous DRAM (SDRAM), A nonvolatile memory device is a memory device in which data stored therein is maintained even when power is turned off. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). Flash memory is classified into a NOR memory and a NAND memory.

SUMMARY

Various embodiments of the present disclosure are directed to a semiconductor memory device and a method of operating the semiconductor memory device capable of using a ready/busy line as an input line for transferring a signal provided from an external device.

One embodiment of the present disclosure provides a semiconductor memory device, a memory cell array including a plurality of memory cells, a status signal generator configured to output an internal status signal indicating whether an operation of the memory cell array has been completed or is being performed and a ready/busy line input mode control unit configured to output a ready/busy signal through a ready/busy line based on the internal status signal or to receive an input signal from an external device through the ready/busy line.

The present disclosure provides a method of operating a semiconductor memory device including a plurality of registers, including setting a ready/busy line of the semiconductor memory device as an input line, receiving, from an external device, a parameter set command for changing a value of at least one among the plurality of registers, an address of the at least one register, and data for the at least one register, determining whether the address of the at least one register is an address of a special register and if the address of the at least one register is the address of the special register, executing the parameter set command in response to an input signal that is inputted through the ready/busy line set as the input line.

The present disclosure provides a semiconductor memory device, comprising a ready/busy line configured as an input line to transfer an incoming signal from an external device to the semiconductor memory device, and as an output line to transfer a ready/busy signal from the semiconductor memory device to the external device and a ready/busy line input mode control unit configured to set a ready/busy signal as one of the input line and the output line.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
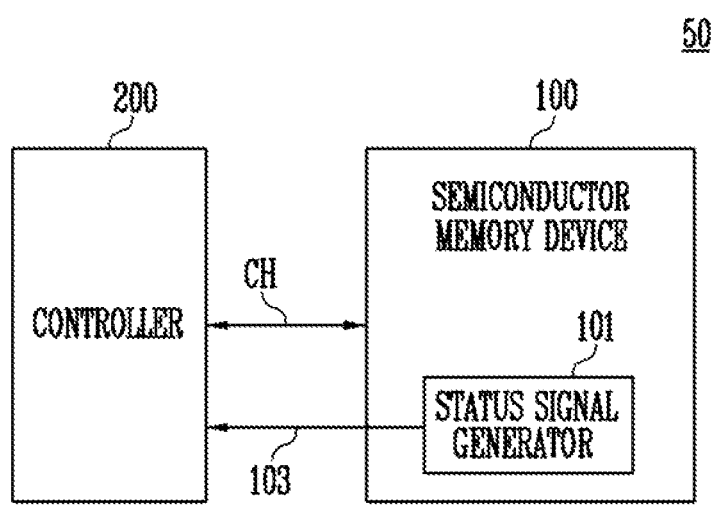
FIG. 1 a block diagram showing a memory system according to an embodiment of the present disclosure.

Example embodiments of the present invention will now be described more fully hereinafter with reference to the accompanying drawings; however, it should be understood that present invention may be may be embodied in different other forms and should not be construed as limited to the embodiments set forth herein. Rather, these embodiments are provided so that this disclosure will be thorough and complete, and will fully convey the present invention to those skilled in the art to which the present invention pertains.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram showing a memory system 50 according to an embodiment of the present disclosure.

Referring to FIG. 1, the memory system 50 may include a semiconductor memory device 100 and a controller 200.

The semiconductor memory device 100 may take many alternative forms, such as a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In addition, the semiconductor memory device 100 according to the present disclosure may be implemented as a three-dimensional array structure. The present disclosure may also be applied not only to a flash memory in which a charge storage layer is implemented as a conductive floating gate (FG), but also to a charge trap flash (CTF) memory in which a charge storage layer is implemented as an insulating layer.

The semiconductor memory device 100 is operated under the control of the controller 200. The semiconductor memory device 100 includes a memory cell array 110 having a plurality of memory blocks BLK1 to BLKZ (see FIG. 2). In an embodiment, the semiconductor memory device 100 may be a flash memory device.

The semiconductor memory device 100 is configured to receive a command and an address from the controller 200 through a channel CH and to access an area selected by the address from the memory cell array. That is, the semiconductor memory device 100 performs an internal operation corresponding to the received command on the selected area of the memory cell array 110.

For example, the semiconductor memory device 100 may perform a program operation, a read operation, and an erase operation. During a program operation, the semiconductor memory device 10 may program data in the area selected by the address. During a read operation, the semiconductor memory device 100 may read data from the area selected by the address. During an erase operation, the semiconductor memory device 100 may erase data stored in the area selected by the address.

The semiconductor memory device 100 includes a status signal generator 101. The status signal generator 101 outputs a status signal indicating whether the semiconductor memory device 100 is in a ready state or in a busy state.

The semiconductor memory device 100 is in a ready state when the semiconductor memory device 100 has completed an internal operation and then stands by waiting for the next command. For example, the semiconductor memory device 100 may be in a ready state after completing a program operation, a read operation or an erase operation in response to a corresponding program, read or erase command received from the controller 200.

The semiconductor memory device 100 may be in a busy state when the semiconductor memory device 100 has not yet completed and is currently still performing an internal operation. For example, the semiconductor memory device 100 may be in a busy state when the semiconductor memory device 100 is still performing a program operation, a read operation or an erase operation corresponding program, read or erase command.

The status signal generator 101 may output a ready or busy signal (ready/busy signal) RB as the status signal. The status signal generator 101 is coupled to the controller 200 through a ready/busy line 103 and outputs the ready/busy signal RB through the ready/busy line 103 to the controller 200. The ready/busy line 103 may be distinct from the channel CH as illustrated in FIG. 1. A high-disabled ready/busy signal RB may represent the ready state of the semiconductor memory device 100, and a low-enabled ready/busy signal RB may represent the busy state of the semiconductor memory device 100. In an embodiment, the output terminal of the ready/busy signal RB having a high impedance may mean that the semiconductor memory device 100 is in a ready state, whereas the output terminal of the ready/busy signal RB having a low impedance may mean that the semiconductor memory device 100 is in a busy state.

The controller 200 controls the semiconductor memory device 100 through the channel CH. The controller 200 may provide a command to the semiconductor memory device 100 in response to a request from a host (not shown). When the status signal indicates a ready state, the controller 200 commands the semiconductor memory device 100 to perform an internal operation corresponding to a received command. When the status signal indicates a busy state, the controller 200 waits for the semiconductor memory device 100 to complete a current operation and only when the status signal is changed to indicate a ready state, the controller 200 may then command the semiconductor memory device 100 to perform the internal operation corresponding to the received command.

In an embodiment, the controller 200 may control the semiconductor memory device 100 so that a program operation, a read operation or an erase operation is performed. During a program operation, the controller 200 may provide a program command, an address, and data to the semiconductor memory device 100 through the channel CH. During a read operation, the controller 200 may provide a read command and an address to the semiconductor memory device 100 through the channel CH. During an erase operation, the controller 200 may provide an erase command and an address to the semiconductor memory device 100 through the channel CH.

The controller 200 may be any suitable controller for coupling the semiconductor memory device 100 to a host. For example, the controller 200 may include components, such as a Random Access Memory (RAM), a processing unit, a host interface, and a memory interface.

The RAM may be used as at least one of a work memory of the processing unit, a cache memory between the semiconductor memory device 100 and the host, and a buffer memory between the semiconductor memory device 100 and the host.

The processing unit may control the overall operation of the controller 200. The processing unit may be configured to control at least one of a read operation, a program operation, an erase operation, and a background operation of the semiconductor memory device 100. The processing unit may be configured to run firmware for controlling the semiconductor memory device 100. In an embodiment, the processing unit may perform a function of a Flash Translation Layer (FTL). The processing unit may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The processing unit may be configured to randomize data received from the host. For example, the processing unit may randomize the data received from the host using a randomizing seed. The randomized data may be provided, as data to be stored, to the semiconductor memory device and is then programmed in the memory cell array.

The processing unit may be configured to derandomize the data received from the semiconductor memory device 100 during a read operation. For example, the processing unit may derandomize the data received from the semiconductor memory device 100 using a derandomizing seed. The derandomized data may be outputted to the host. In an embodiment, the processing unit may perform randomizing and derandomizing operations by running software or firmware.

The host interface may include a protocol for performing data exchange between the host and the controller 200. In an embodiment, the controller 200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface interfaces with the semiconductor memory device 100. For example, the memory interface may include a NAND interface or a NOR interface.

Figure 2:
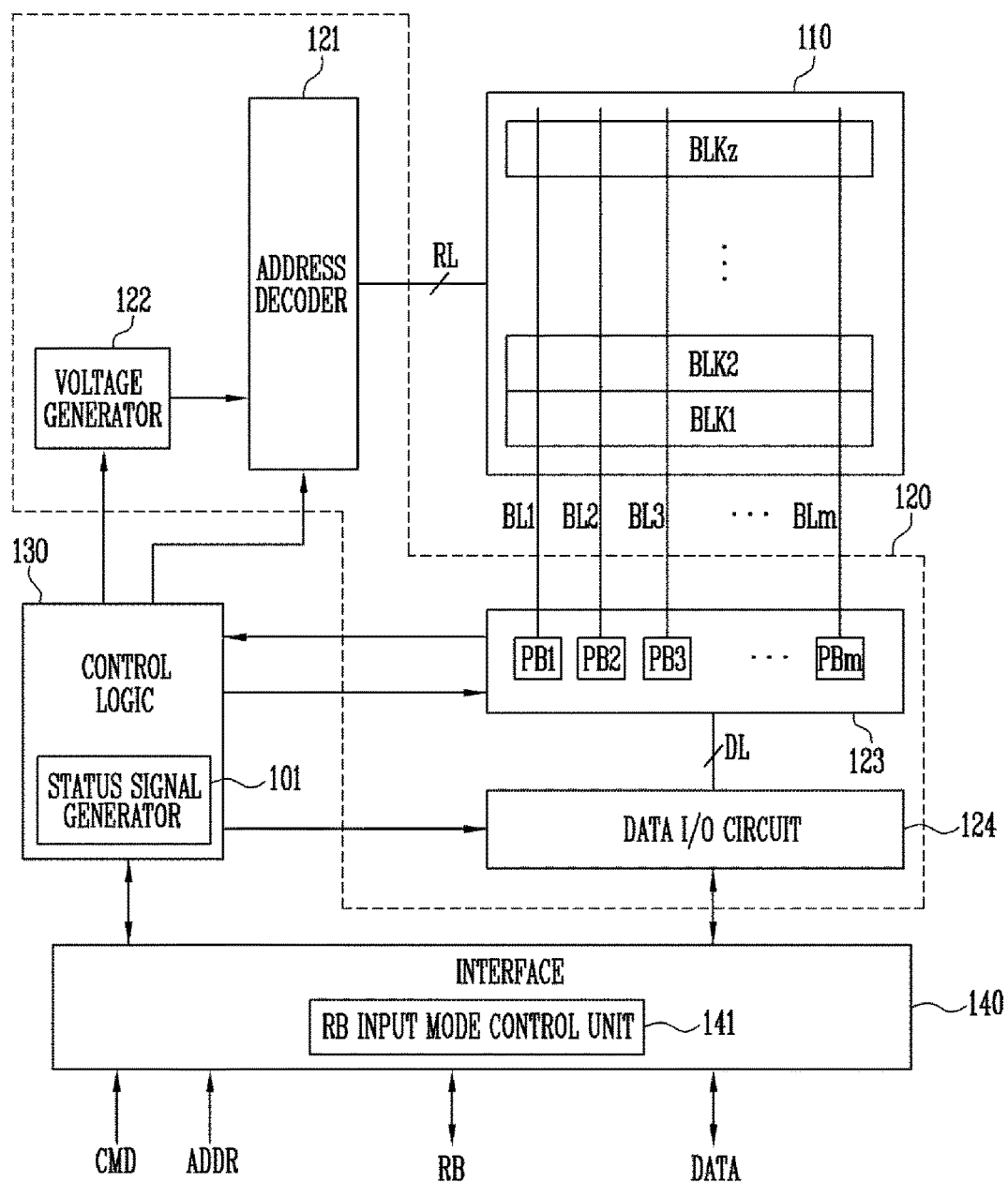
FIG. 2 is a block diagram showing an exemplary configuration of a semiconductor memory device of FIG. 1.

FIG. 2 is a block diagram showing an exemplary configuration of the semiconductor memory device of FIG. 1.

Figure 3:
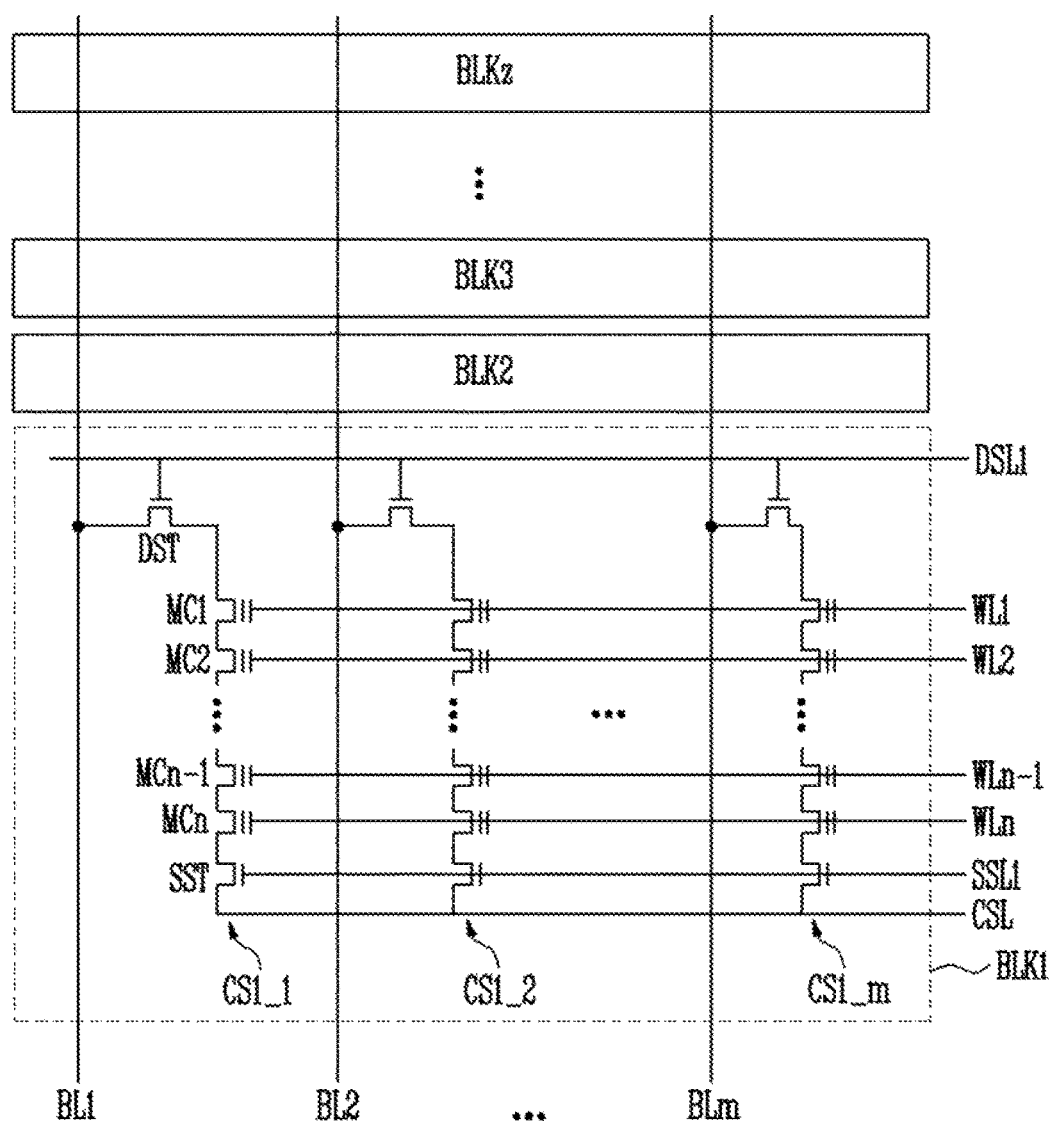
FIG. 3 is a diagram showing an embodiment of a memory cell array of FIG. 2.

FIG. 3 is a diagram showing an embodiment of the memory cell array of FIG. 2.

Referring to FIG. 2, the semiconductor memory device 100 may include a memory cell array 110, a peripheral circuit 120, control logic 130, and an interface 140.

The memory cell array 110 may be coupled to an address decoder 121 through a plurality of row lines RL which include source select lines SSL, word lines WL, and drain select lines DSL and may be coupled to a read and write circuit 123 through bit lines BL.

The memory cell array 110 includes a plurality of memory blocks BLK1 to BLKz. The plurality of memory blocks BLK1 to BLKz are coupled to the address decoder 121 through row lines RL. The memory blocks BLK1 to BLKz are coupled to the read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 100 is composed of a plurality of pages.

The memory cells of the semiconductor memory device 100 may be each implemented as a single level cell (SLC) capable of storing a single data bit, a multi-level cell (MLC) capable of storing two data bits, a triple-level cell (TLC) capable of storing three data bits, or a quad-level cell (QLC) capable of storing four data bits.

A memory cell array 110_1 of FIG. 3 illustrates an embodiment of the memory cell array 110 of FIG. 2.

Referring to FIG. 3, first to z-th memory blocks BLK1 to BLKz included in the memory cell array 110_1 are coupled in common to first to m-th bit lines BL1 to BLm. In FIG. 3, for the convenience of description, elements included in the first memory block BLK1, among the plurality of memory blocks BLK1 to BLKz, are illustrated, and respective elements included in remaining memory blocks BLK2 to BLKz are omitted. It will be understood that each of the remaining memory blocks BLK2 to BLKz is configured in the same way as the first memory block BLK1.

The memory block BLK1 includes a plurality of cell strings CS1_1 to CS1_m. The first to m-th cell strings CS1_1 to CS1_m are coupled to the first to m-th bit lines BL1 to BLm, respectively.

Each of the first to m-th cell strings CS1_1 to CS1_m includes a drain select transistor DST, a plurality of series-connected memory cells MC1 to MCn, and a source select transistor SST. The gate of the drain select transistor DST of each of the first to the m-th cell strings CS1_1 to CS1_m is coupled to a common drain select line DSL1 shared by the cell strings CS1_1 to CS1_m. The gates of the first to n-th memory cells MC1 to MCn are coupled to first to n-th word lines WL1 to WLn, respectively. The gate of the source select transistor SST of each of the first to the m-th cell strings CS1_1 to CS1_m is coupled to a common source select line SSL1 shared by the cell strings CS1_1 to CS1_m. A drain of the drain select transistor DST is coupled to the corresponding bit line. Drain select transistors of the first to m-th cell strings CS1_1 to CS1_m are coupled to the first to m-th bit lines BL1 to BLm, respectively. A source of the source select transistor SST is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Referring back to FIG. 2, the peripheral circuit 120 may include the address decoder 121, a voltage generator 122, the read and write circuit 123, and a data input/output (I/O) circuit 124.

The peripheral circuit 120 may drive the memory cell array 110. For example, the peripheral circuit 120 may drive the memory cell array 110 so that at least one of a program operation, a read operation, and an erase operation are performed.

The address decoder 121 is coupled to the memory cell array 110 through the row lines RL. The address decoder 121 is configured to be operated in response to the control of the control logic 130. The address decoder 121 receives an address ADDR from the control logic 130 through an input/output buffer (not shown) provided in the semiconductor memory device 100. The address decoder 121 may receive the address ADDR from the control logic 130 through an input/output buffer (not shown).

The address decoder 121 is configured to decode a block address of the received address ADDR. The address decoder 121 selects at least one memory block from among the memory blocks BLK1 to BLKz in response to the decoded block address. The address decoder 121 is configured to decode a row address of the received address ADDR. The address decoder 121 may select at least one word line of the selected memory block based on the decoded row address. The address decoder 121 may select at least one word line of the selected memory block by applying one or more voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verification voltage to a selected word line and apply a verification pass voltage higher than the verification voltage to unselected word lines.

During a read operation, the address decoder 121 may apply a read voltage to a selected word line and apply a pass voltage higher than the read voltage to unselected word lines.

In an embodiment, an erase operation of the semiconductor memory device 100 is performed on a memory block basis. During an erase operation, the address ADDR inputted to the semiconductor memory device 100 includes a block address. The address decoder 121 may decode the block address and select a single memory block in response to the decoded block address. During an erase operation, the address decoder 121 may apply a ground voltage to a word line coupled to the selected memory block.

In an embodiment, the address decoder 121 may be configured to decode a column address of the received address ADDR. A decoded column address DCA may be transferred to the read and write circuit 123. In an exemplary embodiment, the address decoder 121 may include components such as a row decoder, a column decoder, and an address buffer.

The voltage generator 122 is configured to generate a plurality of voltages using an external supply voltage provided to the semiconductor memory device 1000. The voltage generator 122 is operated under the control of the control logic 130.

In an embodiment, the voltage generator 122 may generate an internal supply voltage by regulating the external supply voltage. The internal supply voltage generated by the voltage generator 122 is used as an operating voltage of the semiconductor memory device 100.

In an embodiment, the voltage generator 122 may generate a plurality of voltages using an external supply voltage or an internal supply voltage. The voltage generator 122 may be configured to generate various voltages required by the semiconductor memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage and may generate a plurality of voltages by selectively activating the pumping capacitors under the control of the control logic 130.

The generated voltages may be supplied to the memory cell array 110 by the address decoder 121.

The read and write circuit 123 includes first to m-th pages buffers PB1 to PBm. The first to m-th page buffers PB1 to PBm are coupled to the memory cell array 100 through the first to m-th bit lines BL1 to BLm, respectively. The first to m-th page buffers PB1 to PBm are operated under the control of the control logic 130.

The first to m-th page buffers PB1 to PBm perform data communication with the data I/O circuit 124. During a program operation, the first to m-th page buffers PB1 to PBm receive data to be stored DATA through the data I/O circuit 124 and data lines DL.

During a program operation, the first to m-th page buffers PB1 to PBm may transfer the data DATA, received through the data I/O circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage (e.g. a ground voltage) is applied may have increased threshold voltages. Threshold voltages of memory cells coupled to a bit line to which a program prohibition voltage (e.g. a supply voltage) is applied may be maintained. During a program verify operation, the first to m-th page buffers read page data from the selected memory cells through the bit lines BL1 to BLm.

During a read operation, the read and write circuit 123 reads data DATA from the memory cells in the selected page through the bit lines BL, and outputs the read data DATA to the data I/O circuit 124.

During an erase operation, the read and write circuit 123 may float the bit lines BL. In an embodiment, the read and write circuit 123 may include a column select circuit.

The data I/O circuit 124 is coupled to the first to m-th page buffers PB1 to PBm through the data lines DL. The data I/O circuit 124 is operated under the control of the control logic 130. During a program operation, the data I/O circuit 124 receives data to be stored DATA from an external controller (not shown). During a read operation, the data I/O circuit 124 outputs the data, received from the first to m-th page buffers PB1 to PBm included in the read and write circuit 123, to the external controller.

The control logic 130 may be coupled to the address decoder 121, the voltage generator 122, the read and write circuit 123, and the data I/O circuit 124. The control logic 130 may be configured to control the overall operation of the semiconductor memory device 100. The control logic 130 may be operated in response to a command CMD received from an external device.

The control logic 130 may include the status signal generator 101. The control logic 130 may control the output of the status signal generator 101 depending on whether the semiconductor memory device 100 is in the ready state or in the busy state.

The status signal generator 101 may output an internal status signal to the interface 140. The interface 140 may output any one of the ready signal and the busy signal through a ready/busy line in response to the received internal status signal.

In an embodiment of the present disclosure, the ready/busy line of the interface 140 may be used as an input line for transferring signal provided from an external device. In this case, the control logic 130 may determine synchronism or asynchronism of various operations performed by the semiconductor memory device 100 using signals inputted through the ready/busy line. For example, the control logic 130 may determine the synchronism of the operations in response to the signals inputted through the ready/busy line. Alternatively, the control logic 130 may determine whether to perform various operations that are conducted by the semiconductor memory device 100 using signals inputted through the ready/busy line.

For example, the control logic 130 may receive, from the external device, a command related to a parameter set operation of changing values of registers included in the semiconductor memory device 100. More specifically, the control logic 130 may receive a parameter set command SET PARAMETER from the external device through the interface 140. The parameter set command may indicate an operation of changing values of the registers. The control logic 130 may receive address of a target register data to be written in the target register in response to the parameter set command SET PARAMETER.

The control logic 130 may determine based on the provided address of the target register whether the target register is a normal register or a special register. A plurality of registers may be classified into the normal register and the special register. The normal register can be accessed by all users, and the special register may be allowed to be accessed only by authorized users. The registers are classified based on addresses, and thus, it may be difficult to limit the use of the special register when an unauthorized user knows the address of the special register. This problem may be solved, according to an embodiment of the present disclosure, by employing the ready/busy line as the input line.

For example, whether or not to perform an operation of changing the value of the special register may be determined depending on an enable signal inputted through the ready/busy line, thus preventing the unauthorized user from accessing the special register.

When the target register is the normal register, the control logic 130 may change the value of the target register with the inputted data.

When the target register is the special register, the control logic 130 may further determine whether to change the value of the target register with the inputted data in response to an enable signal inputted through the ready/busy line. That is, the control logic 130 may change the value of the special register only when the enable signal is inputted through the ready/busy line.

In an embodiment, the ready/busy line may be used to augment power of the semiconductor memory device 100. For example, in order to check an operation status of the semiconductor memory device 100, the controller may transmit a status read command STATUS READ to the semiconductor memory device 100. The semiconductor memory device 100 may output information about whether an operation has been completed to the controller in response to the status read command STATUS READ. In this case, the semiconductor memory device 100 consumes current to output the information in response to the status read command STATUS READ. When the semiconductor memory device 100 has a multi-stack structure, the amount of current consumption required for the output may increase. When the ready/busy line is used as a separate power pad for supplying an external supply voltage, even if IR (current*resistance) drop occurs during the output, the IR drop may be compensated by the power augmentation through the ready/busy line as the separate power pad for supplying an external supply voltage, and thus a stable operation is possible.

The interface 140 may interface data communication between the semiconductor memory device 100 and the external device. The interface may include a NAND interface or a NOR interface according to the type of semiconductor memory device 100.

In accordance with an embodiment of the present disclosure, the interface 140 may set the ready/busy line coupled to the external device as the input line transferring signal provided from an external device. For this operation, the interface 140 may include a ready/busy line (RB) input mode control unit 141.

When the ready/busy line is used as an output line transferring signal provided from the semiconductor memory device 100, the interface 140 may receive the internal status signal from the status signal generator 101 included in the control logic 130 and then output the ready/busy signal through the ready/busy line.

The ready/busy line (RB) input mode control unit 141 may set the ready/busy line as the input line transferring signal provided from an external device or as the output line transferring signal provided from the semiconductor memory device 100. When the ready/busy line RB is used as the input line, the ready/busy signals may not be outputted to the external device. The interface 140 may further include an input buffer for receiving a signal transferred from an external device through the ready/busy line working as the input line. The interface 140 may transfer the signal inputted through the ready/busy line RB to the control logic 130.

Figure 4:
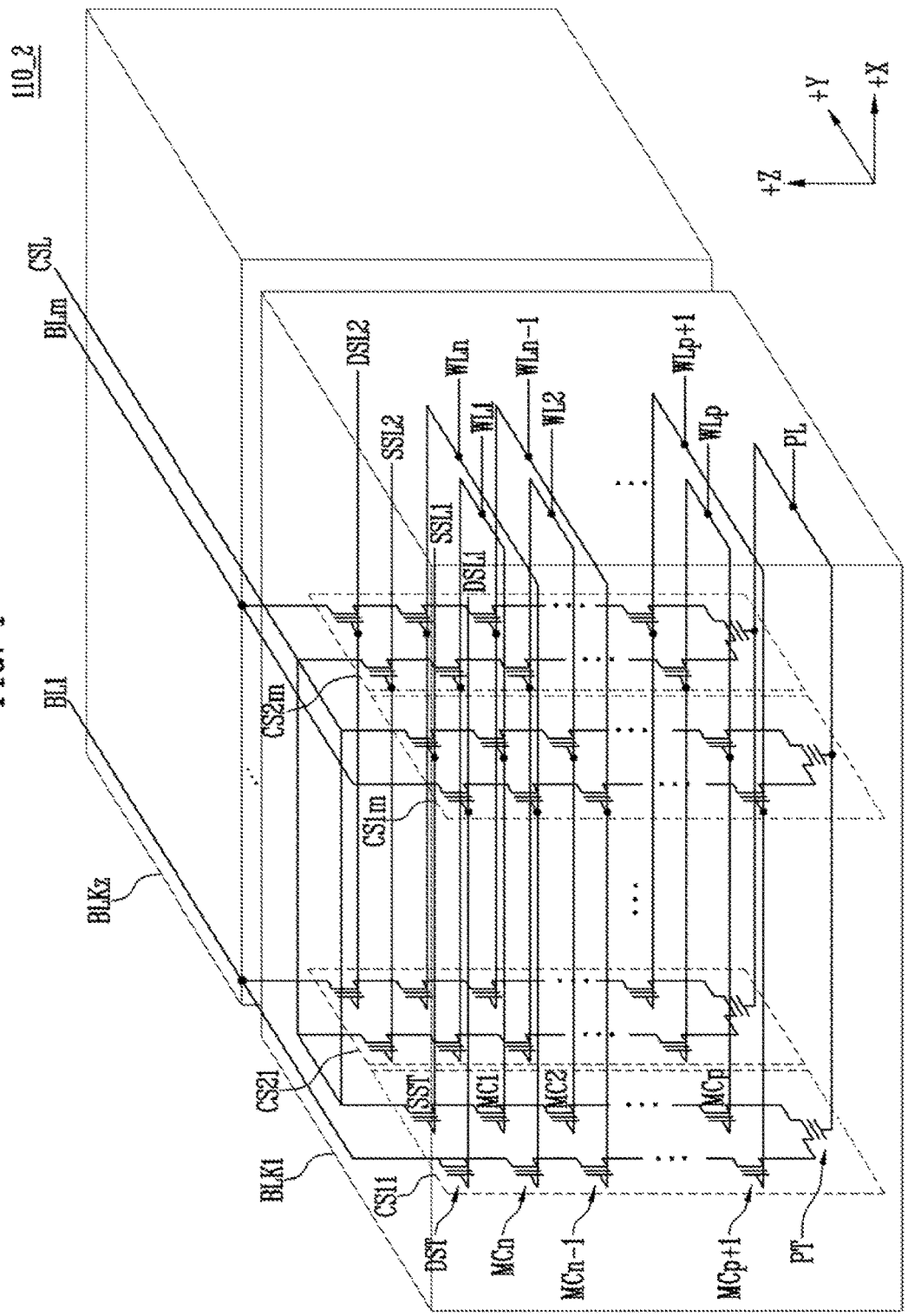
FIG. 4 illustrates another embodiment of the memory cell array of FIG. 2.

FIG. 4 is a diagram showing another embodiment of the memory cell array 110 of FIG. 2.

Referring to FIG. 4, a memory cell array 110_2 includes a plurality of memory blocks BLK1 to BLKz. In FIG. 4, for the convenience of description, the internal configuration of the first memory block BLK1 is illustrated, and the internal configuration of remaining memory blocks BLK2 to BLKz is omitted. It will be understood that the second to z-th memory blocks BLK2 to BLKz are configured in the same way as the first memory block BLK1.

Referring to FIG. 4, the first memory block BLK1 includes a plurality of cell strings CS11 to CS1m and CS21 to CS2m. In an embodiment, each of the cell strings CS11 to CS1m and CS21 to CS2m may be formed in a 'U' shape. In the first memory block BLK1, m cell strings are arranged in a row direction (i.e. a positive (+) X direction). In FIG. 4, two cell strings are shown as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the gates of the source select transistors of cell strings arranged in the same row are coupled to a source select line extended in a row direction, and the gates of the source select transistors of cell strings arranged in different rows are coupled to different source select lines. In FIG. 4, the gates of the source select transistors of cell strings CS11 to CS1m in a first row are coupled to a first source select line SSL1. The gates of the source select transistors of cell strings CS21 to CS2m in a second row are coupled to a second source select line SSL2.

In another embodiment, the gates of the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

In an embodiment, at least one of the first to n-th memory cells MC1 to MCn may be used as a dummy memory cell. When a dummy memory cell is provided, the voltage or current of the corresponding cell string may be more stably controlled. Accordingly, the reliability of data stored in the memory block BLK1 may also be improved.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. The gates of the drain select transistors of cell strings CS11 to CS1m in the first row are coupled to a first drain select line DSL1. The gates of the drain select transistors of cell strings CS21 to CS2m in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

Figure 5:
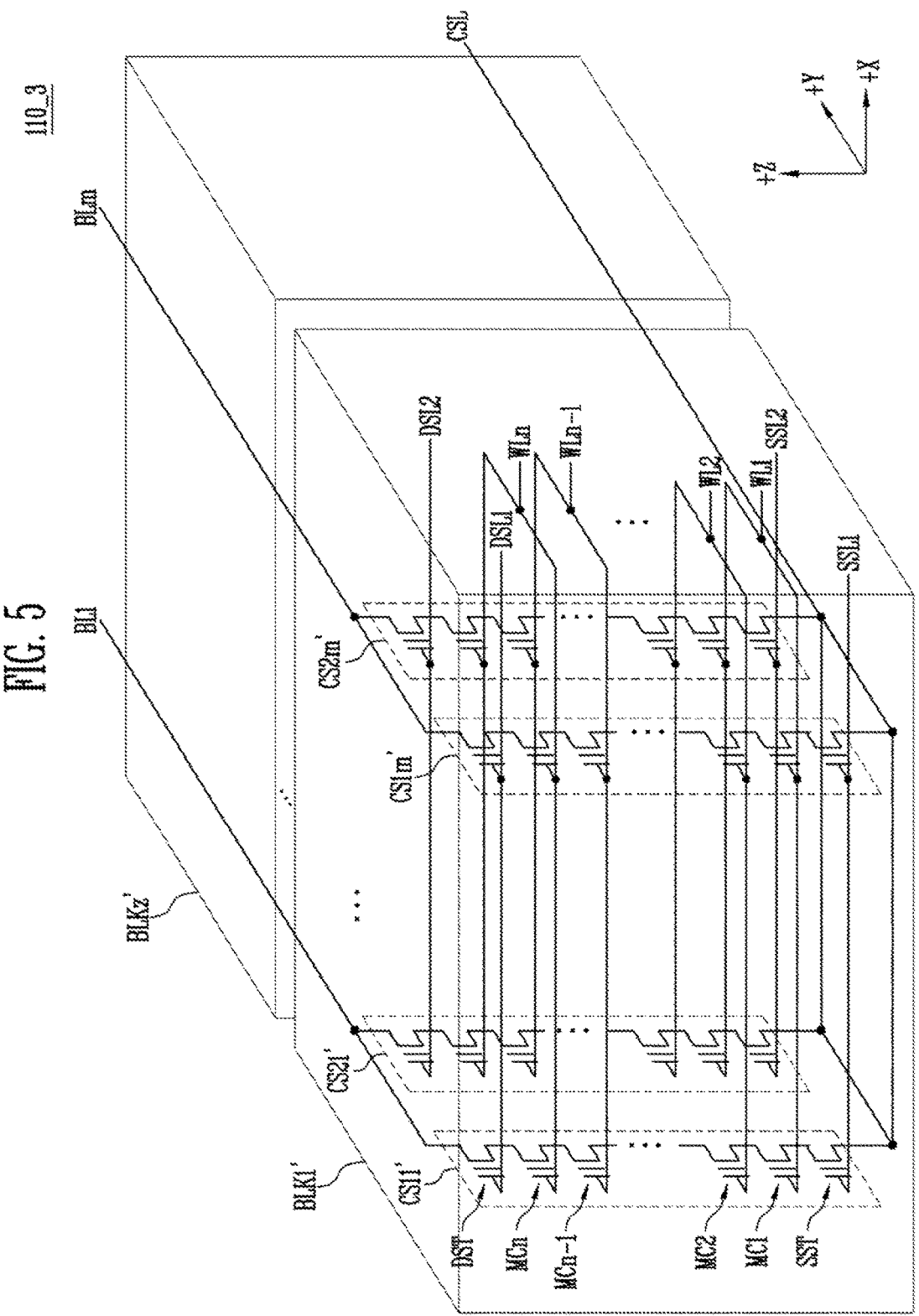
FIG. 5 illustrates a further embodiment of the memory cell array of FIG. 2.

FIG. 5 is a diagram showing a further embodiment of the memory cell array 110 of FIG. 2.

Referring to FIG. 5, a memory cell array 110_3 includes a plurality of memory blocks BLK1' to BLKz'. In FIG. 5, for the convenience of description, the internal configuration of the first memory block BLK1' is illustrated, and the illustration of the internal configuration of remaining memory blocks BLK2' to BLKz' is omitted. It will be understood that the second to z-th memory blocks BLK2' to BLKz' are configured in the same manner as the first memory block BLK1.

The first memory block BLK1' includes a plurality of cell strings CS11' to CS1m' and CS21' to CS2m'. Each of the plurality of cell strings CS11' to CS1m' and CS21' to CS2m' is extended along a +Z direction. In the first memory block BLK1', m cell strings are arranged in a +X direction. In FIG. 5, two cell strings are shown as being arranged in a +Y direction. However, this configuration is made for the convenience of description, and it will be understood that three or more cell strings may be arranged in a column direction.

Each of the cell strings CS11i' to CS1m' and CS21' to CS2m' includes at least one source select transistor SST, first to n-th memory cells MC1 to MCn, and at least one drain select transistor DST.

The source select transistor SST of each cell string is connected between a common source line CSL and memory cells MC1 to MCn. The gates of the source select transistors of cell strings arranged in the same row are coupled to the same source select line. The gates of the source select transistors of cell strings CS11' to CS1m' arranged in a first row are coupled to a first source select line SSL1. The gates of source select transistors of cell strings CS21' to CS2m' arranged in a second row are coupled to a second source select line SSL2. In another embodiment, the gates of the source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Accordingly, the reliability of data stored in the memory block BLK1' is improved.

The drain select transistor DST of each cell string is connected between the corresponding bit line and the memory cells MC1 to MCn. The gates of drain select transistors of cell strings arranged in a row direction are coupled to drain select lines extended in a row direction. The gates of the drain select transistors of the cell strings CS11' to CS1m' in the first row are coupled to a first drain select line DSL1. The gates of the drain select transistors of the cell strings CS21' to CS2m' in the second row are coupled to a second drain select line DSL2.

As a result, the memory block BLK1' of FIG. 5 has an equivalent circuit similar to that of the memory block BLK1 of FIG. 4 except that a pipe transistor PT is excluded from each cell string.

Figure 6:
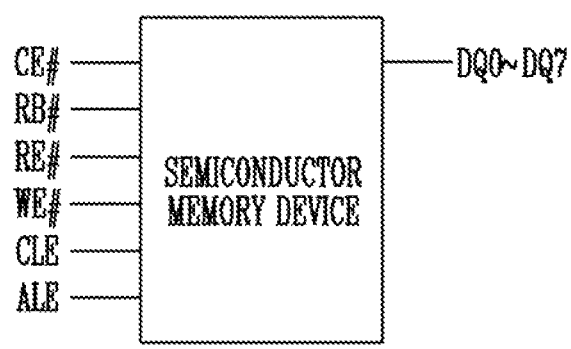
FIG. 6 is a diagram illustrating an exemplary pin configuration of a semiconductor memory device of FIG. 1.

FIG. 6 is a diagram illustrating the pin configuration of the semiconductor memory device 100.

Referring to FIG. 6, the semiconductor memory device 100 may communicate with an external controller through a plurality of lines.

The semiconductor memory device 100 may communicate with the controller through a chip enable (CE#) line, a command latch enable (CLE) line, an address latch enable (ALE) line, a write enable (WE#) line, a read enable (RE#) line, a ready/busy (RB#) line, and data input/output (DQ0 to DQ7) lines.

A signal on the chip enable (CE#) line is a chip enable signal indicating that the corresponding semiconductor memory device 100 is operable. The chip enable (CE#) signal may be selectively applied to storage devices coupled to the same channel. As the chip enable (CE#) signal goes low, it indicates that all operations in the corresponding chip are possible. As the chip enable (CE#) signal goes high, the corresponding chip may be in a standby state.

A ready/busy (RB#) signal goes low while an internal operation is performed in the chip, thus preventing the correspond chip from exchanging other signals with the outside of the chip. When the ready/busy (RB#) signal is high, it indicates that the chip is in a ready state.

A command latch enable signal CLE goes high while the command CMD is inputted to a storage device. An address latch enable signal ALE goes high while the address ADD is inputted to the storage device.

The command CMD and the address ADD are inputted to a selected storage device when a write enable signal WE# makes a transition from high to low.

The write enable signal WE# is toggled when the command and the address are loaded into the storage device, and a read enable signal RE# is toggled when data is loaded into the controller.

The data input/output (DQ0 to DQ7) lines may transfer the command, address, and data to the semiconductor memory device 100 or may transfer data from the semiconductor memory device 100 to the controller. Since data is composed of 8 bits, the number of data input/output (DQ0 to DQ7) lines is 8. However, the number of data input/output lines is not limited to 8, but it may be increased to 16 or 32 in various embodiments.

In accordance with an embodiment of the present disclosure, the ready/busy (RB#) line may be used as an input line for receiving a signal from the external device, in addition to being used as the output line indicating whether the semiconductor memory device 100 is operated. In an embodiment, the signal inputted through the ready/busy (RB#) line may be used for determining synchronism or asynchronism of an operation to be performed by the semiconductor memory device 100. Alternatively, in response to the signal inputted through the ready/busy (RB#) line, the semiconductor memory device 100 may perform an operation.

Figure 7:
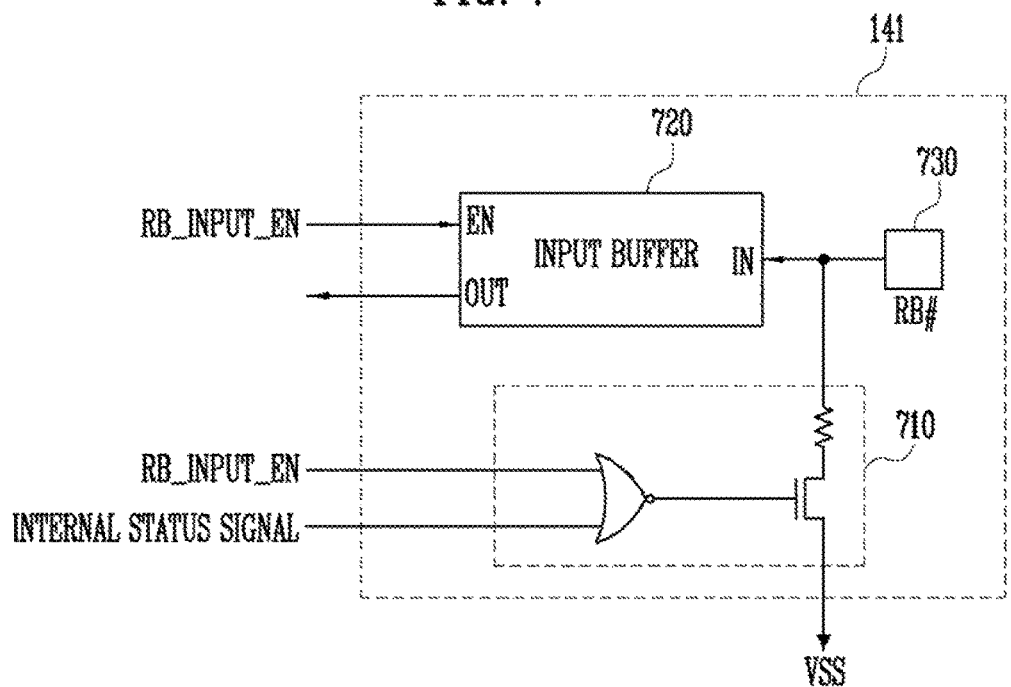
FIG. 7 is a diagram illustrating an exemplary configuration of a ready/busy line input mode control unit of FIG. 2.

FIG. 7 is a diagram illustrating an exemplary configuration of the ready/busy line input mode control unit 141 of FIG. 2.

Referring to FIG. 7, the ready/busy line input mode control unit 141 may include an input/output control unit 710, an input buffer 720, and a ready/busy pad (RB#) 730.

The input/output control unit 710 may set the ready/busy line as the input line transferring signal provided from an external device or as the output line transferring signal provided from the semiconductor memory device 100. The input/output control unit 710 may receive a ready/busy line input enable signal RB_INPUT_EN and an internal status signal, and may output the internal status signal depending on the ready/busy line input enable signal RB_INPUT_EN. More specifically, when the ready/busy line input enable signal RB_INPUT_EN is inputted, the input/output control unit 710 may set the ready/busy line as the input line and may not output the internal status signal to the ready/busy pad (RB#). In contrast, when the ready/busy line input enable signal RB_INPUT_EN is not inputted, the input/output control unit 710 may set the ready/busy line as the output line and may output the internal status signal to the ready/busy pad (RB#).

The input buffer 720 may receive the signal inputted through the ready/busy pad (RB#) 730 and may transfer the received signal to the control logic 130 when the input/output control unit 710 sets the ready/busy line as the input line. When the input/output control unit 710 sets the ready/busy line as the input line, the input/output control unit 710 may not output the internal status signal and may allow the input buffer 720 to receive signal inputted through the ready/busy pad (RB#) 730. The input buffer 720 may transfer a signal from the ready/busy pad (RB#) 730 to the control logic 130 depending on the ready/busy line input enable signal RB_INPUT_EN.

The ready/busy pad (RB#) 730 may be coupled to the external device. For example, the ready/busy pad (RB#) 730 may be coupled to the external device through wiring. When the ready/busy line is set as the output line, the ready/busy pad (RB#) 730 may output the ready/busy signal in response to the internal status signal. When the ready/busy line is set as the input line, a signal is transferred from the external device to the semiconductor memory device 100 through the ready/busy pad (RB#) 730 and the input buffer 720.

Figure 8:
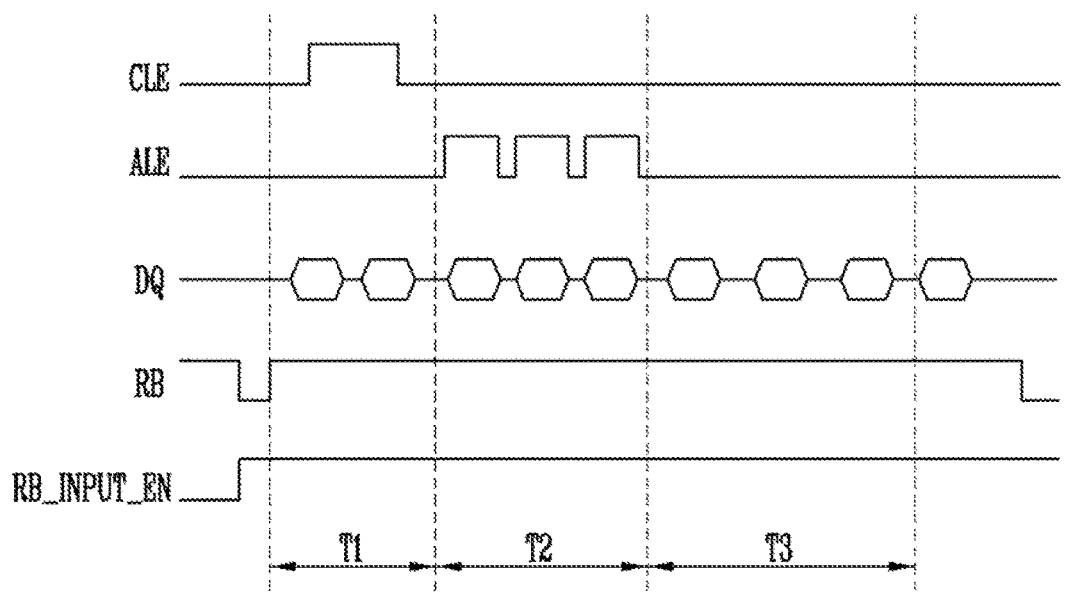
FIG. 8 is a diagram showing waveforms of signals illustrating an operation of a semiconductor memory device according to an embodiment of the present disclosure.

FIG. 8 is a diagram showing waveforms of signals illustrating an operation of the semiconductor memory device 100 according to an embodiment of the present disclosure.

FIG. 8 shows signals inputted through the pins of the semiconductor memory device 100 when the ready/busy line is set as the input line.

Referring to FIG. 8, an embodiment in which the semiconductor memory device 100 sets the ready/busy line as the input line will be described through intervals T1 to T3.

During the interval T1, the command latch enable signal CLE of the semiconductor memory device 100 is in a high state, and the address latch enable signal ALE thereof is in a low state.

Since the command latch enable signal CLE is in a high state, a signal inputted through a data input/output (DQ) line during the interval T1 may be a command.

Since the ready/busy line input enable signal RB_INPUT_EN is in a high state, the ready/busy line (RB) is currently set as the input line. Therefore, a high-state signal inputted through the ready/busy line (RB) is inputted to the semiconductor memory device 100, rather than a status signal that is outputted from the semiconductor memory device 100.

During the interval T2, the address latch enable signal ALE of the semiconductor memory device 100 is in a high state, and the command latch enable signal CLE thereof is in a low state.

Since the address latch enable signal ALE is in a high state, a signal that is inputted through the data input/output (DQ) line during the interval T2 may be an address.

During the interval T3, both the command latch enable signal CLE and the address latch enable signal ALE of the semiconductor memory device 100 are in a low state, and thus a signal that is inputted through the data input/output (DQ) line during the interval T3 may be data.

The command inputted during the interval T1 may be a parameter set command SET PARAMETER.

The command inputted during the interval T2 may be the address of the target register in which a parameter is to be set. When data to replace the value of the normal register is inputted during the interval T3, the semiconductor memory device 100 may change the value of the normal register. For example, when that an address inputted during the interval T2 is the address of the special register (i.e., the target register is the special register), the value of the special register may be changed in response to the input of the enable signal through the ready/busy line (RB).

Figure 9:
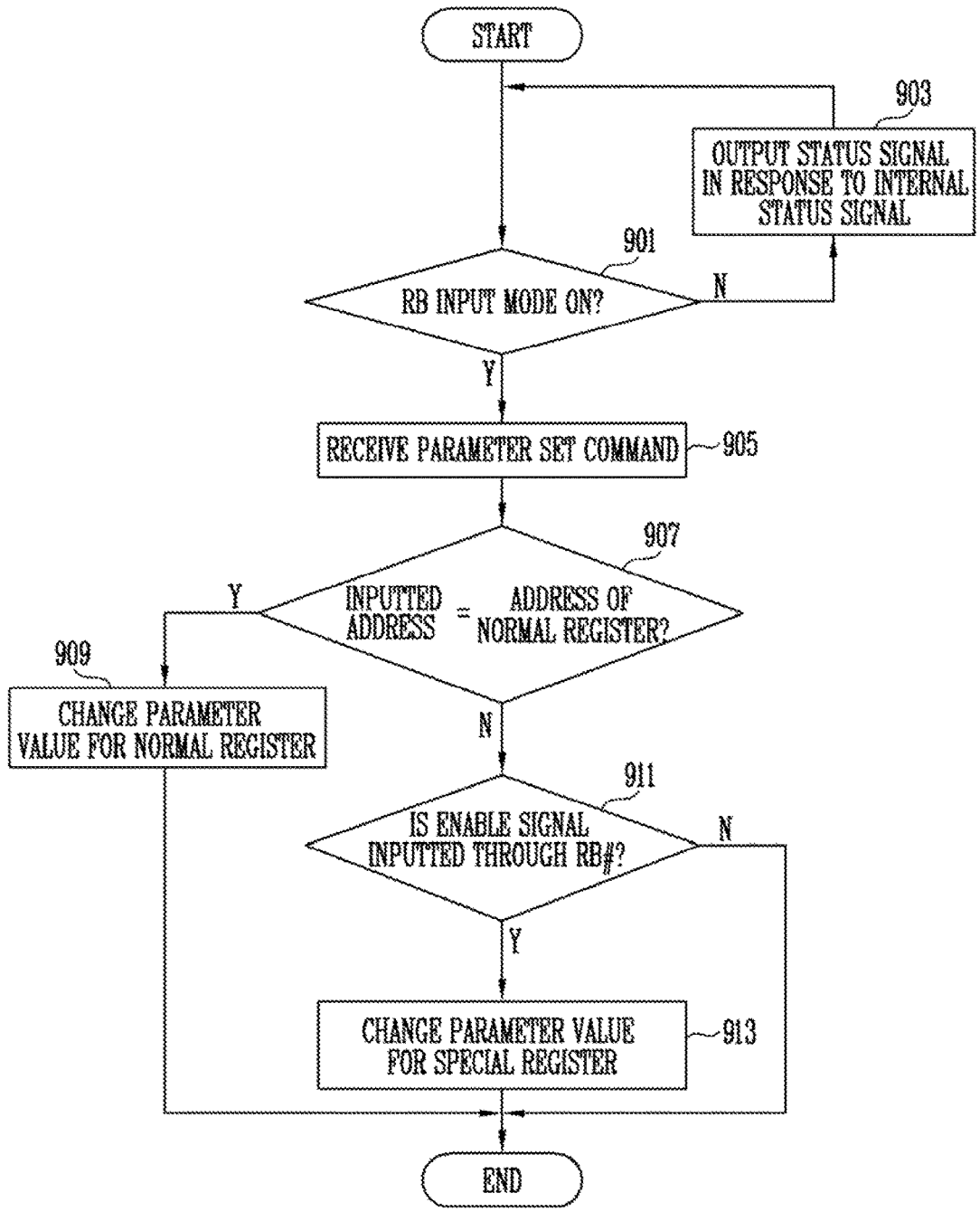
FIG. 9 is a flowchart showing a method of operating a semiconductor memory device according to an embodiment of the present disclosure.

FIG. 9 is a flowchart showing a method of operating the semiconductor memory device 100 according to an embodiment of the present disclosure.

Referring to FIG. 9, at step 901, when the ready/busy line RB is set to the output line according to the ready/busy line input enable signal RB_INPUT_EN as described with reference to FIG. 7, the process proceed to step 903, whereas when the ready/busy line RB is set to the input line according to the ready/busy line input enable signal RB_INPUT_EN, the process proceeds to step 905.

At step 903, the ready/busy signal may be output through the ready/busy line working as the output line according to the internal status signal outputted from the status signal generator 101 included in the control logic 130.

At step 905, the semiconductor memory device 100 may receive the parameter set command SET PARAMETER from the external device.

At step 907, when the address corresponding to the inputted parameter set command SET PARAMETER is the address of the normal register, the process proceeds to step 909 where the value of a parameter for the corresponding normal register may be changed. When the address corresponding to the parameter set command SET PARAMETER is the address of the special register, the process proceeds to step 911.

At step 911, when an enable signal has not been inputted from the external device through the ready/busy line working as the input line, the semiconductor memory device 100 may terminate the operation without changing the value of the parameter of the special register.

At step 911, when the enable signal has been inputted from the external device through the ready/busy line working as the input line, the semiconductor memory device 100 may change the value of a parameter for the special register at step 913.

Figure 10:
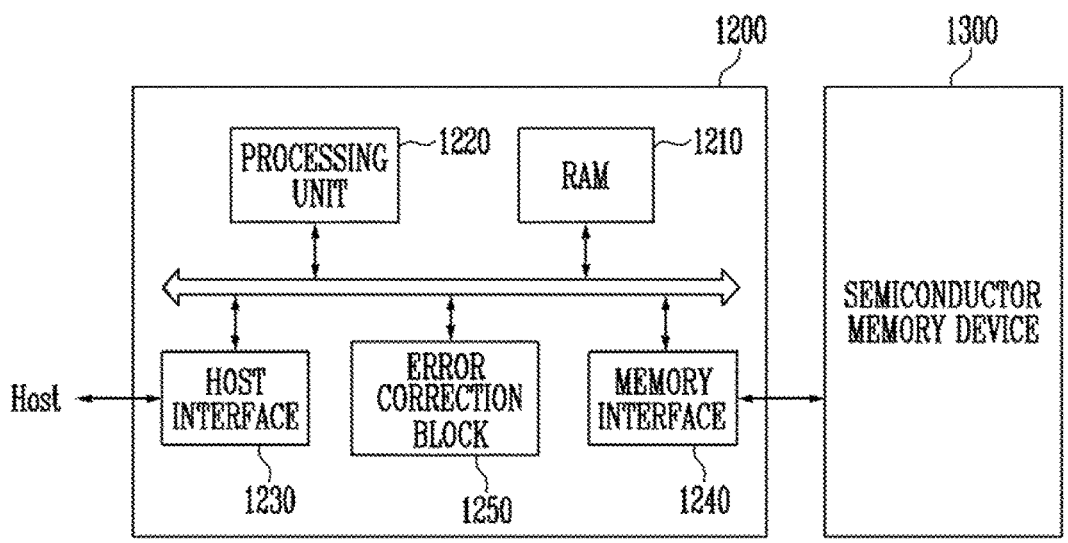
FIG. 10 is a block diagram showing a memory system including the semiconductor memory device of FIG. 2, according to an embodiment of the present disclosure.

FIG. 10 is a block diagram showing a memory system 1000 including the semiconductor memory device of FIG. 2.

Referring to FIG. 10, the memory system 100 includes a semiconductor memory device 1300 and a controller 1200.

The semiconductor memory device 1300 may have the same configuration and operation as the semiconductor memory device 100 described with reference to FIG. 2. Hereinafter, repetitive explanations will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the host Host and the semiconductor memory device 1300. The controller 1200 is configured to run firmware for controlling the semiconductor memory device 1300.

The controller 1200 includes a RAM (Random Access Memory) 1210, a processing unit 1220, a host interface 1230, a memory interface 1240, and an error correction block 1250.

The RAM 1210 is used as any one of a work memory of the processing unit 1220, a cache memory between the semiconductor memory device 1300 and the host Host, and a buffer memory between the semiconductor memory device 1300 and the host Host.

The processing unit 1220 controls the overall operation of the controller 1200. The processing unit 1220 is configured to control a read operation, a program operation, an erase operation and a background operation of the semiconductor memory device 1300. The memory control unit 1220 is configured to run firmware for controlling the semiconductor memory device 100. The processing unit 1220 may perform a function of a Flash Translation Layer (FTL). The processing unit 1220 may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The processing unit 1220 is configured to randomize data received from the host Host. For example, the processing unit 1220 may randomize the data received from the host Host using a randomizing seed. The randomized data is provided, as data to be stored, to the semiconductor memory device 1300 and is then programmed in the memory cell array.

The processing unit 1220 is configured to derandomize the data received from the semiconductor memory device 1300 during a read operation. For example, the processing unit 1220 may derandomize the data received from the semiconductor memory device 1300 using a derandomizing seed. The derandomized data may be outputted to the host Host.

In an embodiment, the processing unit 1220 may perform randomize and derandomize operations by running software or firmware.

The host interface 1230 includes a protocol for performing data exchange between the host Host and the controller 1200. In an exemplary embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 interfaces with the semiconductor memory device 1300. For example, the memory interface 1240 includes a NAND interface or NOR interface.

The error correction block 1250 is configured to use an error correcting code (ECC) to detect and correct an error in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fail. When a number of error bits less than or equal to the number of correctable bits are included in the page data, decoding may succeed. A success in decoding indicates that the corresponding read command has passed. A failure in decoding indicates that the corresponding read command has failed. When decoding succeeds, the controller 1200 outputs error-corrected page data to the host.

The controller 1200 and the semiconductor memory device 1300 may be integrated into a single semiconductor device. In an exemplary embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data in a semiconductor memory. When the memory system is used as the SSD, an operation speed of the host Host coupled to the memory system may be phenomenally improved.

In another embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 1300 or the memory system may be embedded in various types of packages. For example, the semiconductor memory device 1300 or the memory system may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 11:
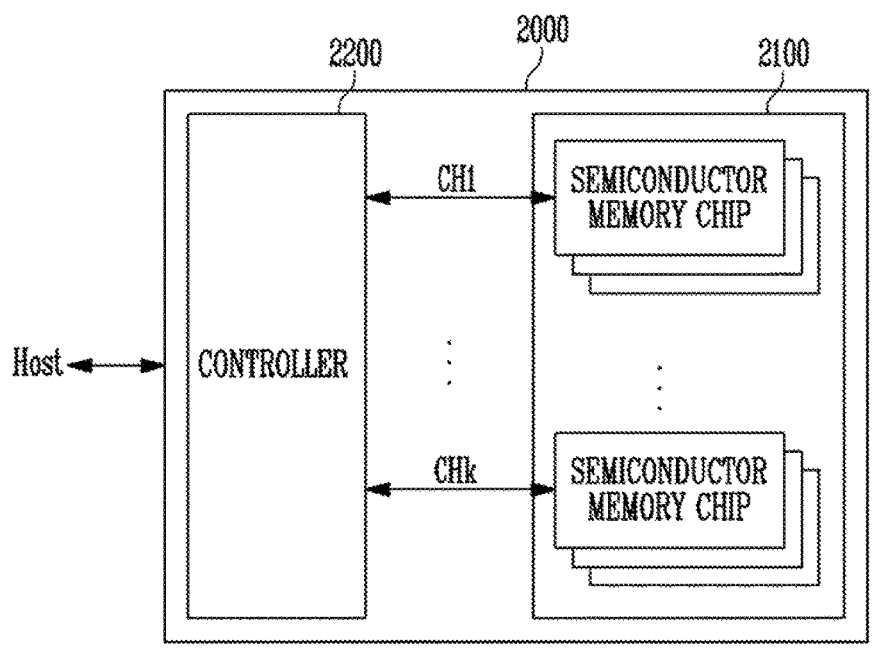
FIG. 11 is a block diagram showing an example of application of the memory system of FIG. 10, according to an embodiment of the present disclosure.

FIG. 11 is a block diagram showing an example 2000 of application of the memory system of FIG. 10.

Referring to FIG. 11, the memory system 2000 includes a semiconductor memory device 2100 and a controller 2200. The semiconductor memory device 2100 includes a plurality of semiconductor memory chips. The semiconductor memory chips are divided into a plurality of groups.

In FIG. 11, it is illustrated that each of the plurality of groups communicates with the controller 2200 through first to k-th channels CH1 to CHk. Each semiconductor memory chip may have the same configuration and operation as those of an embodiment of the semiconductor memory device 1300 described with reference to FIG. 10.

Each group communicates with the controller 2200 through one common channel. The controller 2200 has the same configuration as that of the controller 1200 described with reference to FIG. 10 and is configured to control the plurality of memory chips of the semiconductor memory device 2100 through the plurality of channels CH1 to CHk.

In FIG. 11, a plurality of semiconductor memory chips are coupled to a single channel. However, it will be understood that the memory system 2000 may be modified such that a single semiconductor memory chip is coupled to a single channel.

Figure 12:
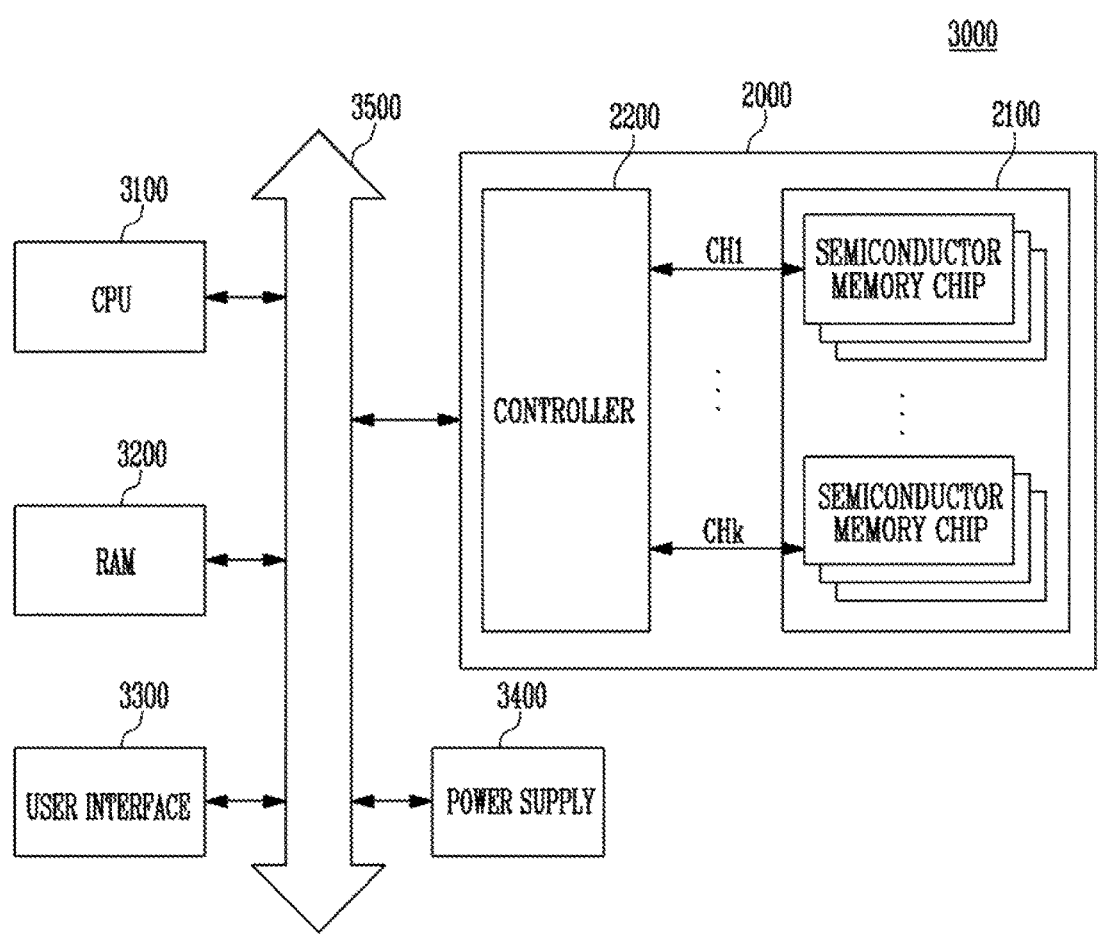
FIG. 12 is a block diagram showing a computing system including the memory system described with reference to FIG. 11, according to an embodiment of the present disclosure.

FIG. 12 is a block diagram showing a computing system including the memory system described with reference to FIG. 11.

Referring to FIG. 12, the computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 12, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 12, the memory system 2000 described with reference to FIG. 11 is illustrated as being provided. However, the memory system 2000 may be replaced with the memory system 1000 described with reference to FIG. 10. In an embodiment, the computing system 3000 may be configured to include all of the memory systems 1000 and 2000 described with reference to FIGS. 10 and 11.

In accordance with the embodiments of the present disclosure, there are provided a semiconductor memory device and a method of operating the semiconductor memory device, which use a ready/busy line as an input line.

Although the invention has been disclosed with specific embodiments, those skilled in the art to which the present invention pertains will appreciate that the present invention is not limited to the described embodiments. Various other modifications, additions and substitutions are possible, without departing from the scope and spirit of the present invention as defined by the appended claims and equivalents of the claims.

In the above-discussed embodiments, all steps may be selectively performed or skipped. In addition, the steps in each embodiment may be not always performed in regular order. Furthermore, the embodiments disclosed in the present specification and the drawings just aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

What is claimed is:

1. A semiconductor memory device, comprising:
a memory cell array including a plurality of memory cells;
a status signal generator configured to output an internal status signal indicating whether an operation of the memory cell array has been completed or is being performed;
a ready/busy line input mode control unit configured to output a ready/busy signal through a ready/busy line based on the internal status signal and to receive an input signal from an external device through the ready/busy line;
a peripheral circuit configured to perform the operation; and
a control logic configured to control the peripheral circuit in response to the input signal,
wherein the ready/busy line input mode control unit comprises:

an input/output control unit configured to set the ready/busy line as one of an input line transferring the input signal and as an output line transferring the ready/busy signal;
an input buffer configured to transfer the input signal inputted through the ready/busy line to the control logic; and
a ready/busy pad configured to couple the ready/busy line to the external device.

2. The semiconductor memory device according to claim 1, wherein the status signal generator outputs a ready signal when the semiconductor memory device completes the operation.

3. The semiconductor memory device according to claim 1, wherein the status signal generator outputs a busy signal while the operation is being performed.

4. The semiconductor memory device according to claim 1, wherein the input signal is a synchronization signal for an operation of the memory cell array corresponding to a command received from the external device.

5. The semiconductor memory device according to claim 1, wherein the semiconductor memory device performs an operation of the memory cell array in response to the input signal.

6. The semiconductor memory device according to claim 1, wherein the input/output control unit is configured to output the ready/busy signal through the ready/busy line depending on a ready/busy line input enable signal.

7. The semiconductor memory device according to claim 6, wherein the input/output control unit is configured to use the ready/busy line as the input line when the ready/busy line input enable signal is inputted.

8. The semiconductor memory device according to claim 6, wherein the input buffer transfers the input signal depending on the ready/busy line input enable signal.

9. The semiconductor memory device according to claim 6, wherein the control logic receives, from the external device, a parameter set command for changing a value of at least one register included in the semiconductor memory device, an address of the at least one register, and data for the at least one register.

10. The semiconductor memory device according to claim 9, wherein the control logic executes the parameter set command in response to the input signal when the at least one register is a special register.

11. A method of operating a semiconductor memory device including a plurality of registers, the method comprising:
setting a ready/busy line of the semiconductor memory device as an input line;
receiving, from an external device, a parameter set command for changing a value of at least one among the plurality of registers, an address of the at least one register, and data for the at least one register;
determining whether the address of the at least one register is an address of a special register; and
if the address of the at least one register is the address of the special register, executing the parameter set command in response to an input signal that is inputted through the ready/busy line set as the input line.

12. The method according to claim 11, wherein the special register is a register that is allowed to be accessed only by an authorized user.

13. The method according to claim 11, further comprising executing the parameter set command if the address of the at least one register is an address of a normal register.

14. The method according to claim 11,
further comprising:
setting the ready/busy line as an output line; and
outputting an internal status signal to the ready/busy line set as the output line,
wherein the internal status signal indicates whether the semiconductor memory device is performing an operation.

15. The method according to claim 13, wherein the normal register is a general-purpose register that is open to an user of the semiconductor memory device.

16. A semiconductor memory device, comprising:
a ready/busy line configured as an input line to transfer an incoming signal from an external device to the semiconductor memory device, and as an output line to transfer a ready/busy signal from the semiconductor memory device to the external device;
a ready/busy line input mode control unit configured to set the ready/busy line as one of the input line and the output line;
a peripheral circuit configured to perform the operation; and
a control logic configured to control the peripheral circuit in response to the input signal,
wherein the ready/busy line input mode control unit comprises:
an input/output control unit configured to set the ready/busy line as one of an input line transferring the input signal and as an output line transferring the ready/busy signal;
an input buffer configured to transfer the input signal inputted through the ready/busy line to the control logic; and
a ready/busy pad configured to couple the ready/busy line to the external device.

17. The semiconductor memory device of claim 16, further comprising:
a status signal generator configured to output an internal status signal indicating whether an operation of the semiconductor memory device to a memory cell array is on-going or completed,
wherein the ready/busy line input mode control unit further outputs to the external device the ready/busy signal based on the internal status signal.

18. The semiconductor memory device according to claim 16,
further comprising an input/output control unit configured to set the ready/busy line as one of the input line and the output line in response to a ready/busy line input enable signal.

* * * * *